(12) United States Patent
Cho (10) Patent No.: US 6,240,532 B1
(45) Date of Patent: May 29, 2001

(54) PROGRAMMABLE HIT AND WRITE POLICY FOR CACHE MEMORY TEST

(75) Inventor: James Y. Cho, Los Gatos, CA (US)

(73) Assignee: Rise Technology Company, Santa Clara, CA (US)

(*) Notice: Subject to any disclaimer, the term of this patent is extended or adjusted under 35 U.S.C. 154(b) by 0 days.

(21) Appl. No.: 09/055,727

(22) Filed: Apr. 6, 1998

(51) Int. Cl.[7] .................................................. G06F 11/00
(52) U.S. Cl. ............................................. 714/42; 714/718
(58) Field of Search .................................... 714/42, 5, 25, 714/30, 31, 32, 48, 718, 719, 733, 742, 44, 720, 763; 365/201

(56) References Cited

U.S. PATENT DOCUMENTS

| | | |
|---|---|---|
| 4,575,792 | 3/1986 | Keeley . |
| 5,195,096 * | 3/1993 | Moore ................................. 371/21.1 |
| 5,249,281 | 9/1993 | Fuccio et al. . |
| 5,276,833 * | 1/1994 | Auvinen et al. ..................... 395/425 |
| 5,287,481 | 2/1994 | Lin . |
| 5,497,458 * | 3/1996 | Finch et al. ...................... 395/183.06 |
| 5,524,208 * | 6/1996 | Finch et al. ...................... 395/183.01 |
| 5,537,355 * | 7/1996 | Banerjee et al. ..................... 365/201 |
| 5,629,950 * | 5/1997 | Godiwala et al. .................. 371/51.1 |
| 5,663,965 * | 9/1997 | Seymour .......................... 371/22.31 |
| 5,671,231 * | 9/1997 | Cooper ............................... 371/22.1 |
| 5,835,704 * | 11/1998 | Li et al. .......................... 395/183.18 |
| 5,938,777 * | 8/1999 | Carter .................................... 714/32 |
| 5,974,510 * | 10/1999 | Cheng et al. ........................ 711/138 |

* cited by examiner

*Primary Examiner*—Nadeem Iqbal
(74) *Attorney, Agent, or Firm*—Oblon, Spivak, McClelland, Maier & Neustadt, P.C.

(57) ABSTRACT

In a program test of the cache of a microprocessor, a forced hit signal can be set by the CPU. The forced hit signal allows for a more complete testing of the cache. Additionally, a forced write back signal can also be produced. In one embodiment, the forced hit signal will cause the tag RAM to be updated during a write with the forced hit.

29 Claims, 5 Drawing Sheets

PROGRAMMABLE HIT AND WRITE POLICY FOR CACHE MEMORY TEST

FIELD OF THE INVENTION

The present invention relates to a testing method and apparatus for cache memory of a microprocessor on an integrated circuit.

BACKGROUND OF THE INVENTION

The arrangement of the memory for a microprocessor has an important role in establishing the overall performance of the computer system. Memory is typically slower than internal Central Processing Unit (CPU) operations particularly when the CPU is on one chip while the main memory is distributed among a number of other chips. Access to resources on the same chip is much faster than access to resources outside the chip. For this reason, most modern microprocessors have a cache memory formed on the same integrated circuit.

Figure 1:
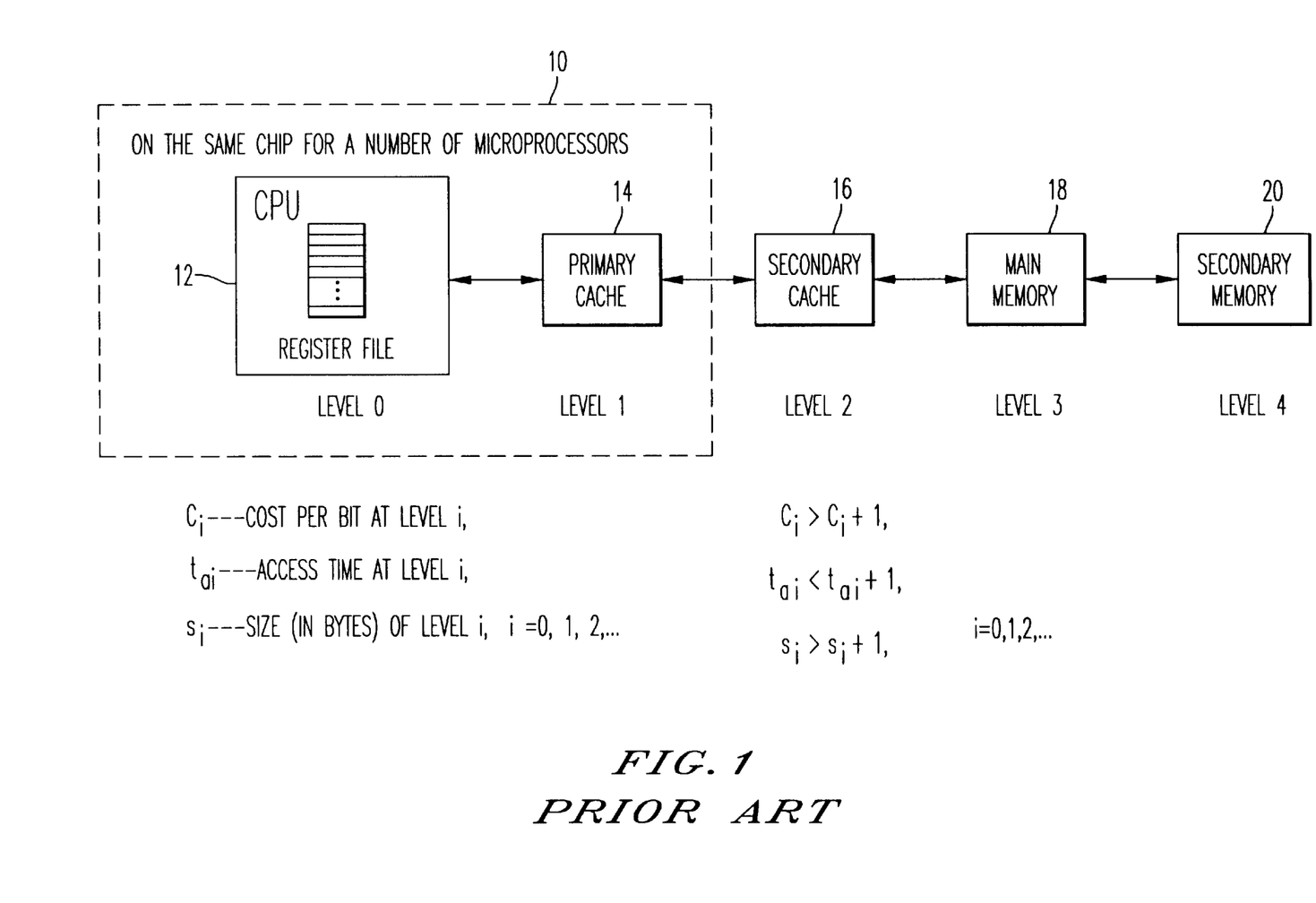
FIG. 1 is a diagram of the prior art memory higherarchy for a computer system.

FIG. 1 is a prior art illustration of the memory higherarchy for a microprocessor which has been adapted from the book, *Advanced Microprocessors*, Second Edition, D. Tabak, McGraw-Hill, Inc. 1995. The microprocessor 10 includes the CPU 12 with its associated registers. Chip 10 also contains the primary cache 14. An optional cache 16 can be positioned off chip. The main memory 18 is the one actually addressed by the CPU. It contains the code and data of the currently running program. Some of this information may also temporarily be stored in the cache. The secondary memory 20, such as magnetic disks and hard drives, is much larger than the main memory. The closer the memory is to the CPU, the more expensive per bit of storage it is, the faster it can be accessed by the CPU, and the smaller its size in bytes.

The high cost of the cache memory is the primary reason why the cache size is limited. Another factor limiting the size of the primary cache is the finite number of resources that can be placed upon the integrated circuit.

Cache operation is based upon the principal of locality. There are two main types of locality:

(1) Temporal locality. If an information item is accessed by the CPU, there is a high probability that it will be accessed again in the near future.

(2) Spacial locality. If an information item is accessed, there is a high probability that other items near by in the program will be accessed in the near future.

The cache takes advantage of these two levels of locality. When an information item is obtained by the CPU from the main memory, it is stored into the cache. It remains in the cache until it is written over by another information item brought in from the main memory. This means that recently accessed data will be in the fast cache. Additionally, when the data is brought in from the main memory, typically a block of data or a "line" is brought in to be stored in the cache. For example, if the CPU operates on 32 bits, a line can be much larger, such as a 256 bits or 32 bytes. This means that when data is loaded into the cache, neighboring data in the same "line" is loaded into the cache.

Figure 2:
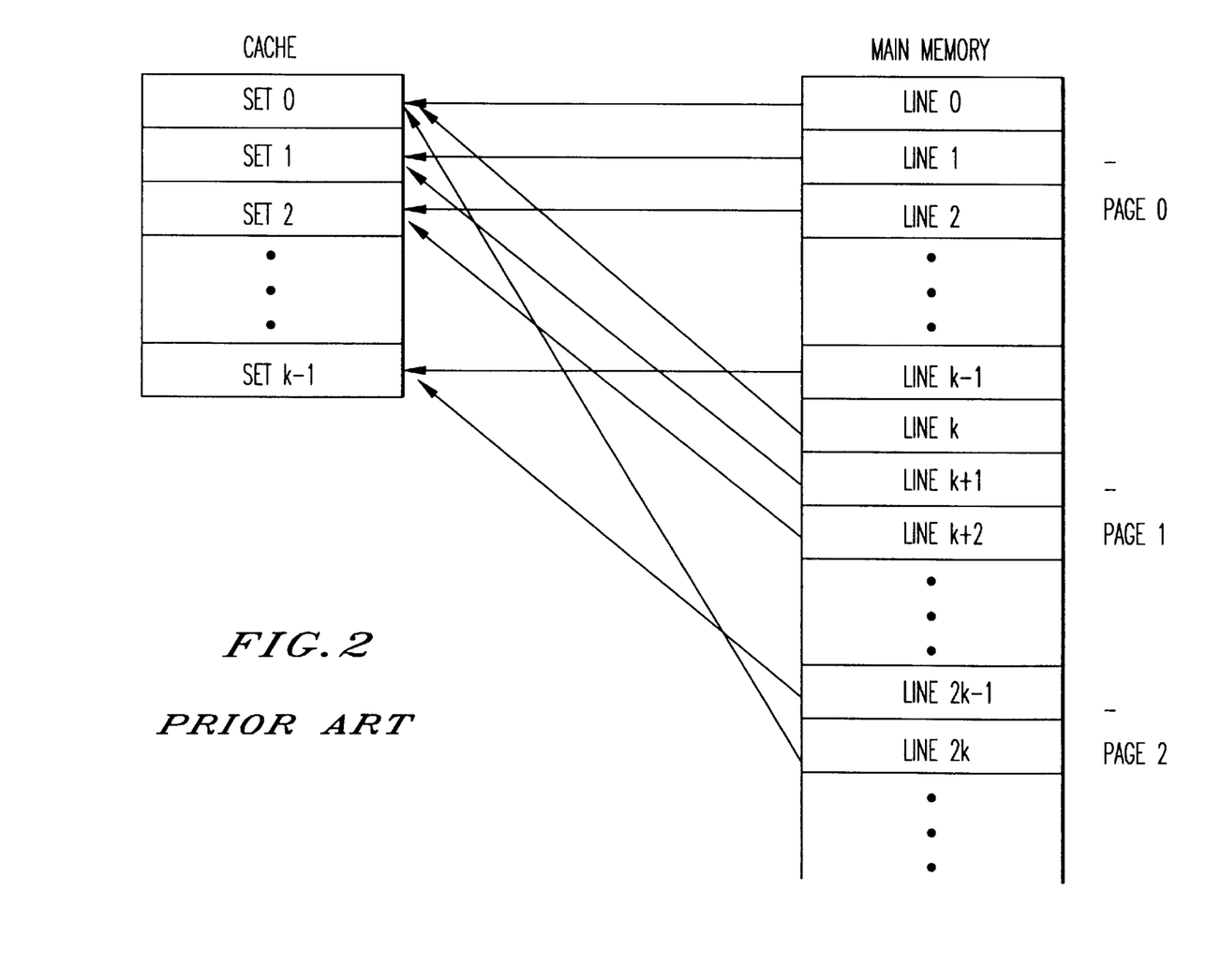
FIG. 2 is a diagram illustrating the set associative mapping between the main memory and the cache.

In most existing systems, the cache is subdivided into sets. Each set may contain a number of lines. The mapping between the main memory and a cache containing K sets is shown in FIG. 2. Line 0 from main memory is stored in set 0 in the cache, line 1 into set 1, line 2 into set 2, and so on. Note that line Ø, 1K and 2K are all stored into set Ø. Note that line X from the main memory would be stored into set X MOD K in the cache.

This method of mapping, practiced in most existing systems, is called "Set Associative Mapping." Each set in the cache may contain several lines. The set associative mapping that allows L lines to be stored in a set is called the "L-Way Set Associative Mapping." For example, Pentium chips have 2-way set associative mapping.

Figure 3:
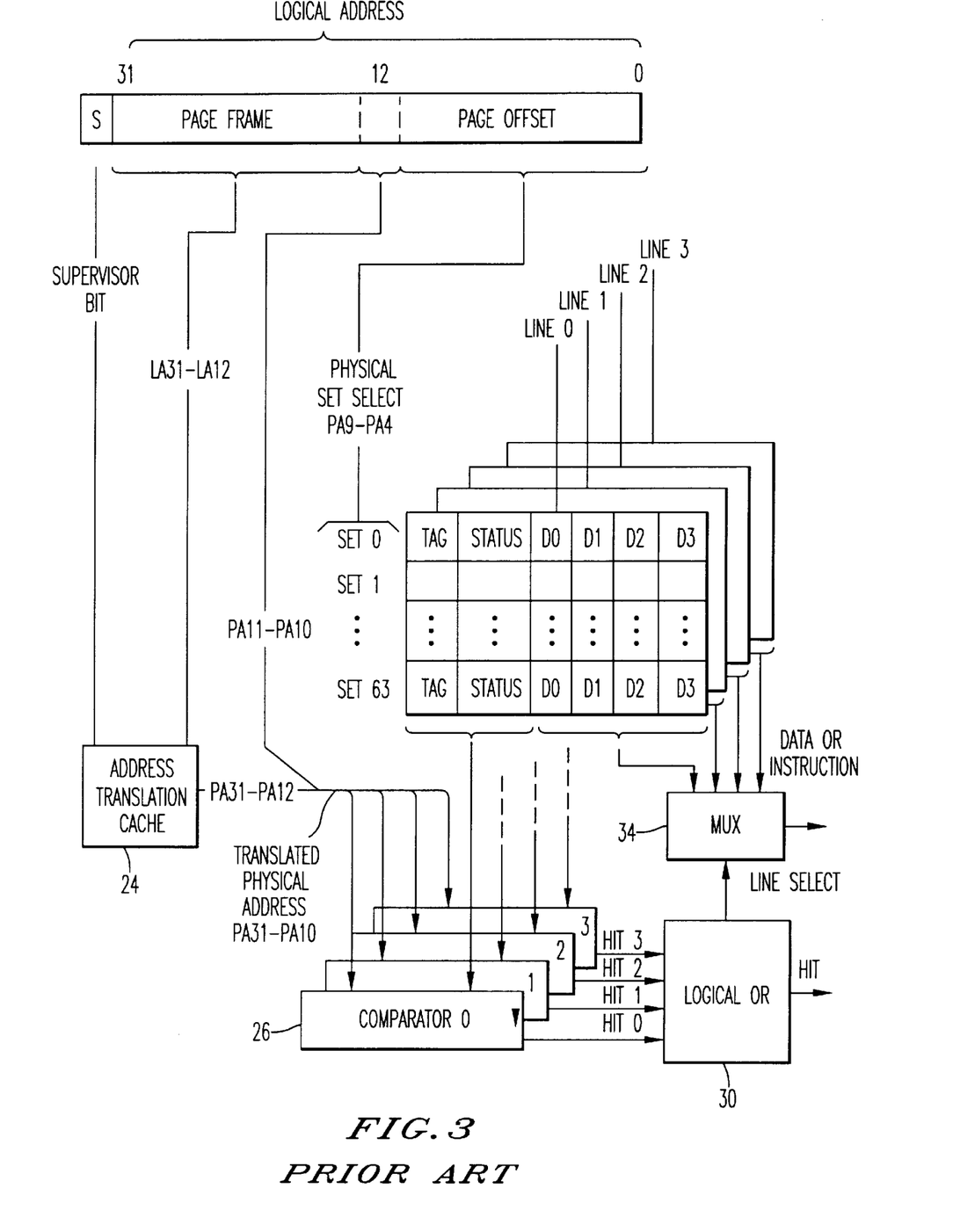
FIG. 3 is a diagram of a prior art cache system.

FIG. 3 is a diagram of an internal cache for the MC680X0 Motorola architecture. This architecture is 4-way set associative. Thus, four lines from the main memory which have the same set number can be stored in the cache. As shown in FIG. 3, the least significant bits of the logical address consists of the page offset. Page offset corresponds to the set number. Lower bits of the offset are used to select the desired word within the lines stored in the cache. The page frame data from the logical address is sent to the address translation cache 24. The address translation cache 24 is usually called a translation look-aside buffer and is used to translate between physical and logical addresses. This translated page data is sent to the comparator 26. The page offset data from the logical address is used to select one of the sets. The tag data for this set in all four of the storage regions is sent to the corresponding comparator. The comparator tells whether the data from a line in main memory is stored in the cache. If there is data stored in the cache, a hit signal, hit 0 to hit 3, is generated. These signals are sent to the "logical or" unit 30 to produce the main hit signal sent to a CPU and a line select signal sent to the multiplexer 34.

The system shown in FIG. 3 is 4-way associative. The higher the level of associativity, the more complex the logic, while the hit ratio is improved. Only a part of a program or data can fit into the cache. The cache is much smaller than the main memory. When the CPU attempts to access any item of information, the item can be either in the cache; which is called a hit, or not in the cache, which is called a miss. When a miss occurs the line containing the missing item is loaded into the cache, replacing another line. In L-way associative mapping, there is L candidates one of which can be replaced in the cache. For example, in a 4-way associative mapping the line can replace one of the four lines having the same set number. The replacement algorithm can be at random; first in first out; or, least recently used.

A brief description of the cache operation is as follows: If there is a hit during the read operation the accessed item is transferred from the cache into the CPU. The main memory is not involved. If there is a hit during the write operation, there are two options. In the writethrough method, a main memory location is updated together with the cache. This method assures data integrity, but results in frequent bus transfers and memory write operations. In the writeback method only the cache is updated on hit, memory is updated only when the updated line is replaced. This method reduces memory bus traffic but may have lengthy periods where there is different values for the same address in memory and in the cache. The writeback method typically uses a bit, sometimes called a "dirty bit" in the tag RAM to indicate that the memory location has not been updated yet or cache has more updated data than the memory. In many systems, the writethrough and the writeback methods are offered as options to the user. If there is a miss during a read operation, the line containing the missing item is transferred from the memory to the cache, replacing another line. If there is a miss during a write operation, the line is either loaded into the cache or not loaded into the cache, depending upon whether the system is designated as write allocate or no-write allocate.

One problem with cache memories is that they are typically harder to test than the main memory. This is because of the relatively complicated addressing logic used with cache memories. Each of the locations of main memory can be accessed with a unique address and test data written-in and read-out to determine the operation of the memory bit. The testing of the cache memory is more complicated because the data addressed are not necessarily in the cache memory and the addresses of data in the cache are stored in a portion of the cache, called the tag RAM, and are only updated as the consequence of the cache miss.

Three main testing methods have been used with cache memory. One method is direct memory access. Additional logic is provided and hardware paths created to provide access to the cache memory directly from input/output (IO) pins. An example of such a system is given in Keeley, U.S. Pat. No. 4,575,792. A problem with this type of method is that a substantial amount of additional hardware paths and control logic is needed. Additionally, the IO timing is often degraded.

The second method is a the built-in self test (the BIST). The problem with this method is that there is typically poor visibility for the test. The built-in self test is usually a go/no-go type of test in which errors can be detected but the location and data patterns of these errors are not identified. This reduces the usefulness of the built-in self test as a debugging tool. An additional problem with the built-in self test is it has poor flexibility because the test pattern or vectors used are fixed.

The third type of test is performed under the programmed control of the CPU. The test pattern and test sequences are flexible and can be modified by the test software. A disadvantage of the functional test method is that there is typically poor test coverage and the tag RAM portion cannot directly be tested. Typically the main memory used with microprocessor systems are significantly smaller than the largest possible logical address for the microprocessor. This means that in order to test the higher significant digits in the TAG RAM field of the cache, a very large tester memory must be used. For example, to test a TAG RAM, first a read would occur causing a miss. The data must be read in from the main memory to be stored in the cache. In order to test the higher level bits of the TAG RAM cache, a very high address main memory is used.

It is desired to have an improved method and apparatus for functional testing of the cache of the microprocessor.

SUMMARY OF THE INVENTION

The present invention involves storing forced hit signals and a forced writeback signal in a register controlled by the CPU. The forced hit signal and forced writeback signal are able to artificially produce a hit so as to help aid in the accessing of the cache for testing. The forced writeback signal can insure that the cache system is in the writeback mode so that data is not written through to the main memory during testing.

Another embodiment in the present invention involves setting a forced hit signal under the programed control of the central processing unit and then using the forced hit signal to gain access to the cache memory during the testing. This allows the CPU to artificially gain access to cache locations during programmed testing without requiring the correct tag to be stored in the tag RAM and without accessing main memory.

An alternate embodiment of the present invention involves a method in which a forced hit signal is set and data is read from the cache. With the forced hit set data can be thus read from the cache without requiring the tag RAM cache to operate correctly.

Another embodiment of the present invention involves the testing of the tag RAM portion of the cache. By implementing tag RAM update feature on the write operation during forced hit set, the tag RAM is directly modified by any addresses the test program presents.

After entire cache is updated with the forced-hit and with writeback set, the test program performs read operation with the forced hit reset. If test program performs the read from the same address as the previous write, the reading out of the correct data proves all tag RAM and compare circuit function correct for the hit case.

If test program perofrms read from the different address from the previous write, cache miss should occur and all cache data are written back to the memory location accessed by the addresses stored in the tag RAM. This proves the miss sequence, and allows to examine the contents of data and tag RAM explicitly.

BRIEF DESCRIPTION OF THE DRAWINGS

The above and other aspects of the invention will be better understood with respect to the figures below.

DETAILED DESCRIPTION OF THE PREFERRED EMBODIMENTS

Figure 4:
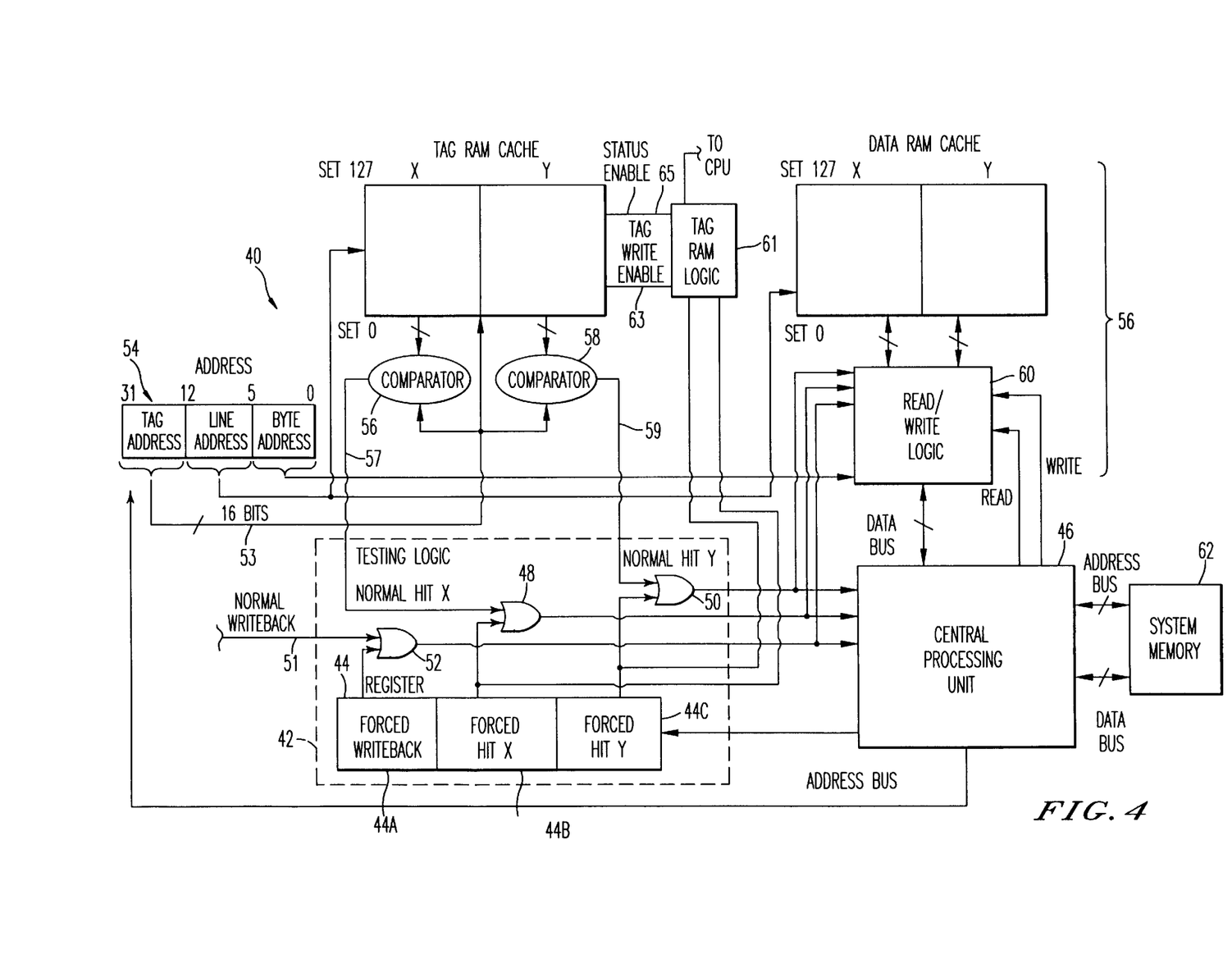
FIG. 4 is a diagram of the cache system of the present invention using the testing logic of the present invention.

FIG. 4 is a diagram of the cache system 40 of the present invention including testing logic 42. Testing logic 42 includes a register 44 under the control of the central processing unit 46. The register 44 includes a forced writeback bit 44*a*, a forced hit X bit 44*b* and a forced hit Y bit 44*c*. The register 44 can, in fact, be one of the status registers of the central processing unit 46.

The forced hit X and forced hit Y bits stored in the register 44 are combined with the normal hit X and a normal hit Y signals in the "logical or" units 48 and 50, respectively. The combined hit signals produced are then sent to the central processing unit 44 and the other logic that uses these hit signals to control the operation of the cache. Thus, by setting the forced hit X and forced hit Y bits in register 44, the testing program can allow the CPU to have access to write and read into the cache. Additionally, the forced writeback bit 44 can be set in order to set the system into the writeback mode to facilitate the testing. The data in the writeback bit 44*a* is combined in the "logical or" unit 52 with the data on the normal writeback line 51.

The testing logic 42 is interconnected to the rest of the cache design. The testing logic of the present invention can, of course, be used with a variety of cache memory designs.

FIG. 4 shows a single port cache. A dual port cache can be implemented by using only one port for the testing; adding an additional set of forced hit registers; or by using a single set of forced hit registers for both ports.

Address 54 is used to access the cache 56. A virtual-to-physical address translation system (not shown), such as a translation look ahead buffer can also be used. The addresses lowest bits, 0 to 4, represent a byte address. This information concerns the byte or group of bytes within the line stored in the cache which is to be accessed. The next set of bits, bits 5 to 11 contain the line address. The line address corresponds to the set number of the data stored in the cache. Bits 12 to 31 of the address 54 are the tag address. This tag address is sent to comparators 56 and 58 along with data stored in the tag for the set number corresponding to the line address. If there is a match of the stored tag data with the tag address, the data for that address is contained in the data RAM. Cache system 40 is a twoway set associative system using two storage regions labeled X and Y. If the data is stored in region X, the normal hit signal is produced on line 57. If the data is stored in region Y, the normal hit Y signal is produced on line 59. The hit signals will cause the data to be read out of the data RAM cache by the read write logic 60 to the central processing unit 46. If there is a miss, data is read from the system memory 62. As described above, the force hit bit 44b and force hit Y bit 44c can be used to fake a hit and thus gain access to the cache 46.

The read and write logic 60 can comprise a multiplexer and shifter so as to extract from a line of cache data sized for the central processing unit. The byte address is used to control the shifter to send the correct size data to the central processing unit. In one embodiment, the central processing unit acts upon 32 bit wide words, whereas the lines stored in the cache are 256 bits; or 32 bytes wide. The read/write logic 60 can also take the 32 bit word and process it into the line and data to be stored into the correct line of the cache during a write operation.

The forced hit signals are also sent to the tag RAM logic 61. The tag RAM logic 61 sets the enable bits for writing into the tag RAM. On a normal write operation with a hit, the tag portion of the tag RAM will contain the correct tag data which does not need to be updated. The tag RAM logic 61 causes the tag address on bus 53 to be written into the tag portion of the tag RAM cache when there is a write and forced hit sending the write enable signal on line 63. The tag RAM logic 61 also sets the status enable lines. In particular, the validity bit also needs to be set upon a write with a forced hit. The tag RAM logic 61 is connected to the central processing unit 46 and receives the write and read signals.

Figure 5:
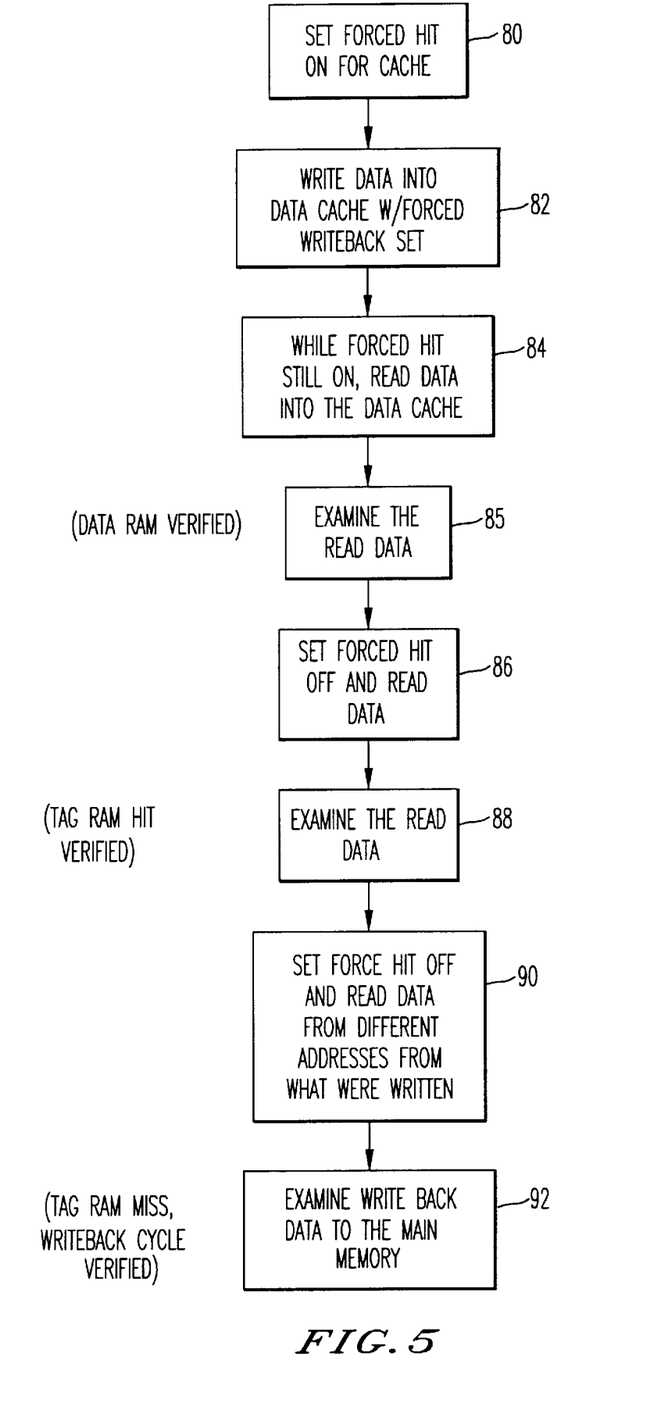
FIG. 5 is a flow chart illustrating the program testing logic as controlled by the CPU.

FIG. 5 is a flow chart illustrating a method of the present invention. In step 80, the testing program loaded into the central processing unit causes a forced hit bit in the register 44 to be set. In step 82, data is written into the data cache. The forced writeback bit 44a is set to prevent the data from being written through to the system memory. It is important to load the tag address and set the validity bit along with the "dirty bit" in the tag RAM on each cache write operation with the forced hit, unless the original cache design already does this.

In step 84, with the forced hit still on, data is read from the data RAM. Thus, in this manner, data can be written in and out of the data RAM cache by setting the line and byte address portions of the address 54 with a forced hit to be set.

In steps 80 through 84, data can be written in and read out of the data RAM cache so as to provide good coverage of the data RAM without requiring the correct operation of the tag RAM cache. Even if there are errors in the tag RAM portion of the cache, the forced hit can allow for access of the data RAM cache for testing.

In step 86, the forced hit signal is turned off and data is read from the tag RAM cache. This step gives indication whether the data has been correctly written in and stored in the tag RAM cache. The stored tag address should match a stored tag in the tag RAM cache. In step 88, if all the data is correct, tag RAM is proved functional for hit.

In step 90, the forced hit signal is turned off and data is accessed such that the replacement algorithm causes all the data in the cache to be written back to the main memory. The accessed data is chosen so that the addresses of this data is not stored in the cache. The access will be attempted and data will not be in the cache. If the system is L-way associative, all L set locations are filled with data. The data will then be loaded from the system memory and stored in the cache by the replacement algorithm. Upon replacement, the modified data will be written back to the main system memory in a writeback operation. This written back data can be examined in step 92 to determine whether the data has been properly stored in the tag RAM cache. If the tag RAM cache has an error, the written back data will be sent to the wrong location.

Note that the steps of FIG. 5 need not be all done to gain partial advantage of the present invention. Steps 80, 82, 84 and 85 are sufficient for a data RAM test; steps 86 and 88 are for a tag RAM hit test; and steps 80, 82, 90 and 92 comprise a tag RAM miss test.

The methods of FIG. 5 can be repeated a number of times with different data stored into the data cache and/or the tag cache so as to get good testing coverage. The test data pattern may be a popular march test, such as 10·n, or whatever appropriate for debugging.

Various details of the implementation and method are merely illustrative of the invention. It will be understood that various changes in such details may be within the scope of the invention, which is to be limited only by the appended claims.

What is claimed is:

1. A method of program testing a cache memory that normally operates in conjunction with a normal hit signal, the method comprising:

setting a forced hit signal in a register under programmed control of a central processing unit; and overriding the normal hit signal with the forced hit signal set in the register so as to indicate that a cache hit has occurred and to gain access to the cache memory during testing regardless of the normal hit signal's value.

2. The method of claim 1, wherein the using step includes writing data into the cache memory with the forced hit signal set.

3. The method of claim 1, wherein the using step includes reading data from the cache memory with the forced hit signal set.

4. The method of claim 1, further comprising setting a forced writeback signal.

5. The method of claim 1, wherein the using step includes testing a tag RAM portion of the cache memory.

6. The method of claim 5, wherein the using step includes writing a first set of data into the cache memory with the forced hit signal set.

7. The method of claim 6, wherein the using step further includes accessing a second set of data with addresses different from the first set of data so that the data is written back out of the cache memory to the main memory.

8. The method of claim 7, wherein the writing step is done with a forced writeback signal set.

9. The method of claim 1, wherein the forced hit signal is connected to enable a tag portion of the address to be stored in a tag RAM portion of the cache memory on a write with a forced hit set.

10. A method of testing a cache memory that normally operates in conjunction with a normal hit signal, comprising:

writing data into the cache memory, the writing step including setting a forced hit signal so as to override the normal hit signal and indicate that a cache hit has occurred regardless of the normal hit signal's value; and thereafter, reading data from the cache memory, the reading step including setting the forced hit signal so as to override the normal hit signal and indicate that a cache hit has occurred regardless of the normal hit signal's value.

11. The method of claim 10, further comprising the step of resetting the forced hit signal and reading data from the cache.

12. The method of claim 10, wherein the reading and writing steps are done under programmed control of a central processing unit.

13. A method of testing a cache memory that normally operates in conjunction with a normal hit signal, comprising:

providing an integrated circuit with the cache memory, the cache memory including a data portion and a tag RAM portion; and reading data from the cache memory, the reading step including setting a forced hit signal so as to override the normal hit signal and indicate that a cache hit has occurred regardless of the normal hit signal's value, so that the data can be read from the data portion without requiring correct operation of the tag RAM portion.

14. The method of claim 13, further comprising writing data into the cache memory before the reading step.

15. The method of claim 14, wherein the writing step includes setting a forced hit signal.

16. The method of claim 13, wherein the reading step is done under programmed control of a central processing unit.

17. The method of claim 13, wherein the forced hit signal is connected to enable a tag portion of the address to be stored in the tag RAM portion of the cache memory on a write with a forced hit set.

18. A method of testing a tag RAM portion of a cache, comprising:

first, writing a first set of data into the cache with a forced hit signal set;

reading a second set of data with addresses different from the first set of data with the forced hit signal reset so that a cache miss results and the first set of data is written out of the cache to a main memory in a second writing step; and examining the data written to the main memory out of the cache.

19. The method of claim 18, wherein the examining step checks that the data read out of the cache in a writeback operation matches the data written in the cache in the first writing step.

20. The method of claim 18, wherein the first writing step is done with a forced writeback signal set.

21. The method of claim 18, wherein the first writing step and the reading step are done under programmed control of a central processing unit.

22. The method of claim 18, wherein the forced hit signal is connected to enable a tag portion of the address to be stored in the tag RAM portion of the cache on a write with a forced hit set.

23. An integrated circuit including:

a cache that normally operates in conjunction with a normal hit signal and a normal writeback signal;

at least one register under control of a CPU for storing at least one forced hit signal and a forced writeback signal; and circuitry, connected to the at least one register, that, during cache testing, overrides the normal hit signal with the forced hit signal so as to indicate that a cache hit has occurred regardless of the normal hit signal's value, and overrides the normal writeback signal with the forced writeback signal so as to force a writeback mode regardless of the normal writeback signal's value.

24. The integrated circuit of claim 23, wherein the circuitry logical OR's an output of a normal hit circuit with the forced hit signal in the at least one register.

25. The integrated circuit of claim 23, wherein the circuitry logical OR's an output of a normal writeback circuit with the forced writeback signal in the at least one register.

26. The integrated circuit of claim 23, wherein the cache includes tag RAM and data RAM portions.

27. The integrated circuit of claim 26, wherein the cache is "L"-way associative and wherein the at least one register has "L" forced hit signals stored.

28. The integrated circuit of claim 23, wherein:

the at least one register is a forced flag register that includes at least one forced hit register and a forced writeback register, and the integrated circuit further comprises the CPU for controlling through the forced flag register the testing of the cache under the programmed control of the CPU.

29. The integrated circuit of claim 23, wherein the forced hit signal is connected to circuitry to enable a tag portion of an address to be stored in a tag RAM portion of the cache on write with a forced hit signal set.

* * * * *

UNITED STATES PATENT AND TRADEMARK OFFICE
CERTIFICATE OF CORRECTION

PATENT NO. : 6,240,532 B1  
DATED : May 29, 2001  
INVENTOR(S) : Cho et al.

It is certified that error appears in the above-identified patent and that said Letters Patent is hereby corrected as shown below:

<u>Title page,</u>  
Item [12] should read:

-- [12] United States Patent  
    Cho et al. --

Item [75], the Inventors should read:

[75] Inventors: James Y. Cho, Los Gatos;  
                Matthew David Ornes, Sunnyvale,  
                both of CA (US) --

Signed and Sealed this

Twelfth Day of March, 2002

*Attest:*

*Attesting Officer*

JAMES E. ROGAN  
*Director of the United States Patent and Trademark Office*